US008159481B2

(12) United States Patent
Chang

(10) Patent No.: US 8,159,481 B2
(45) Date of Patent: Apr. 17, 2012

(54) DISPLAY DRIVER AND RELATED DISPLAY

(75) Inventor: Yu-Jui Chang, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 979 days.

(21) Appl. No.: 11/849,359

(22) Filed: Sep. 4, 2007

(65) Prior Publication Data

US 2009/0058773 A1 Mar. 5, 2009

(51) Int. Cl.
*G06F 3/038* (2006.01)
*G09G 5/00* (2006.01)
*H03L 5/00* (2006.01)

(52) U.S. Cl. ........................... 345/204; 345/98; 327/333

(58) Field of Classification Search ........................ None
See application file for complete search history.

(56) References Cited

U.S. PATENT DOCUMENTS 3,883,786 A * 5/1975 McNaughton et al. ....... 388/811
3,947,777 A * 3/1976 Burger .......................... 329/346
5,867,057 A * 2/1999 Hsu et al. ...................... 327/544
6,853,233 B1 * 2/2005 Terletzki et al. .............. 327/333
7,317,333 B1 * 1/2008 Zhou et al. ...................... 326/80
2003/0058023 A1 * 3/2003 Aoki ............................ 327/333
2004/0239545 A1 * 12/2004 Tsai et al. .................... 341/155
2005/0184788 A1 * 8/2005 Johansson et al. ............ 327/333
2005/0265054 A1 * 12/2005 Luu ................................ 363/89
2005/0280461 A1 * 12/2005 Teraishi ........................ 327/333
2006/0158231 A1 * 7/2006 Soeraasen ....................... 327/91
2006/0255994 A1 * 11/2006 Lin ................................ 341/144
2008/0030253 A1 * 2/2008 Chen et al. .................... 327/333

FOREIGN PATENT DOCUMENTS

TW 200639478 11/2006
TW 200713838 4/2007

* cited by examiner

*Primary Examiner* — Amare Mengistu
*Assistant Examiner* — Antonio Xavier
(74) *Attorney, Agent, or Firm* — Winston Hsu; Scott Margo

(57) ABSTRACT

The present invention discloses a display driver and related display. The display driver includes: a plurality of level shifters, respectively receiving input signals for outputting shifted signals; a plurality of switches; and a digital-to-analog converter, having a plurality of input terminals electrically connected to outputs of the level shifters respectively via the switches directly; wherein the switches are turned off while the level shifters are in a transition to convert the input signals into the shifted signals.

14 Claims, 2 Drawing Sheets

DISPLAY DRIVER AND RELATED DISPLAY

BACKGROUND OF THE INVENTION

1. Field of the Invention

The present invention relates to a display driver and related display, and more particularly, to a display driver for driving an LCD panel and related display.

2. Description of the Prior Art

A conventional display driver for driving an LCD panel includes a plurality of level shifters for respectively receiving input signals and outputting shifted signals and a digital-to-analog converter (DAC) having a plurality of input terminals electrically connected to outputs of the level shifters respectively.

However, when the level shifters are in a transition to convert the input signals into the shifted signals, the voltage levels at the input terminals of the DAC will be possibly affected and a gamma short effect might occur in the DAC. Thus, an innovative display driver is required for eliminating the gamma short effect.

SUMMARY OF THE INVENTION

It is therefore one of the objectives of the present invention to provide a display driver for driving an LCD panel and related display to solve the above problem.

According to an embodiment of the present invention, a display driver is disclosed. The display driver includes: a plurality of level shifters, respectively receiving input signals for outputting shifted signals; a plurality of switches; and a digital-to-analog converter, having a plurality of input terminals electrically connected to outputs of the level shifters respectively via the switches directly; wherein the switches are turned off while the level shifters are in a transition to convert the input signals into the shifted signals.

According to an embodiment of the present invention, a display is disclosed. The display includes a display driver and a panel coupled to the display driver. The display driver includes: a plurality of level shifters, respectively receiving input signals for outputting shifted signals; a plurality of switches; and a digital-to-analog converter, having a plurality of input terminals electrically connected to outputs of the level shifters respectively via the switches directly; wherein the switches are turned off while the level shifters are in a transition to convert the input signals into the shifted signals.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

In the present invention, the display driver for driving an LCD panel includes: a plurality of level shifters, respectively receiving input signals for outputting shifted signals; a plurality of switches; and a digital-to-analog converter (DAC), having a plurality of input terminals electrically connected to outputs of the level shifters respectively via the switches directly; wherein the switches are turned off while the level shifters are in a transition to convert the input signals into the shifted signals. For brevity and ease of understanding for the present invention, only one of the level shifters, the corresponding switches, and the DAC will be described in the following illustration.

Figure 1:
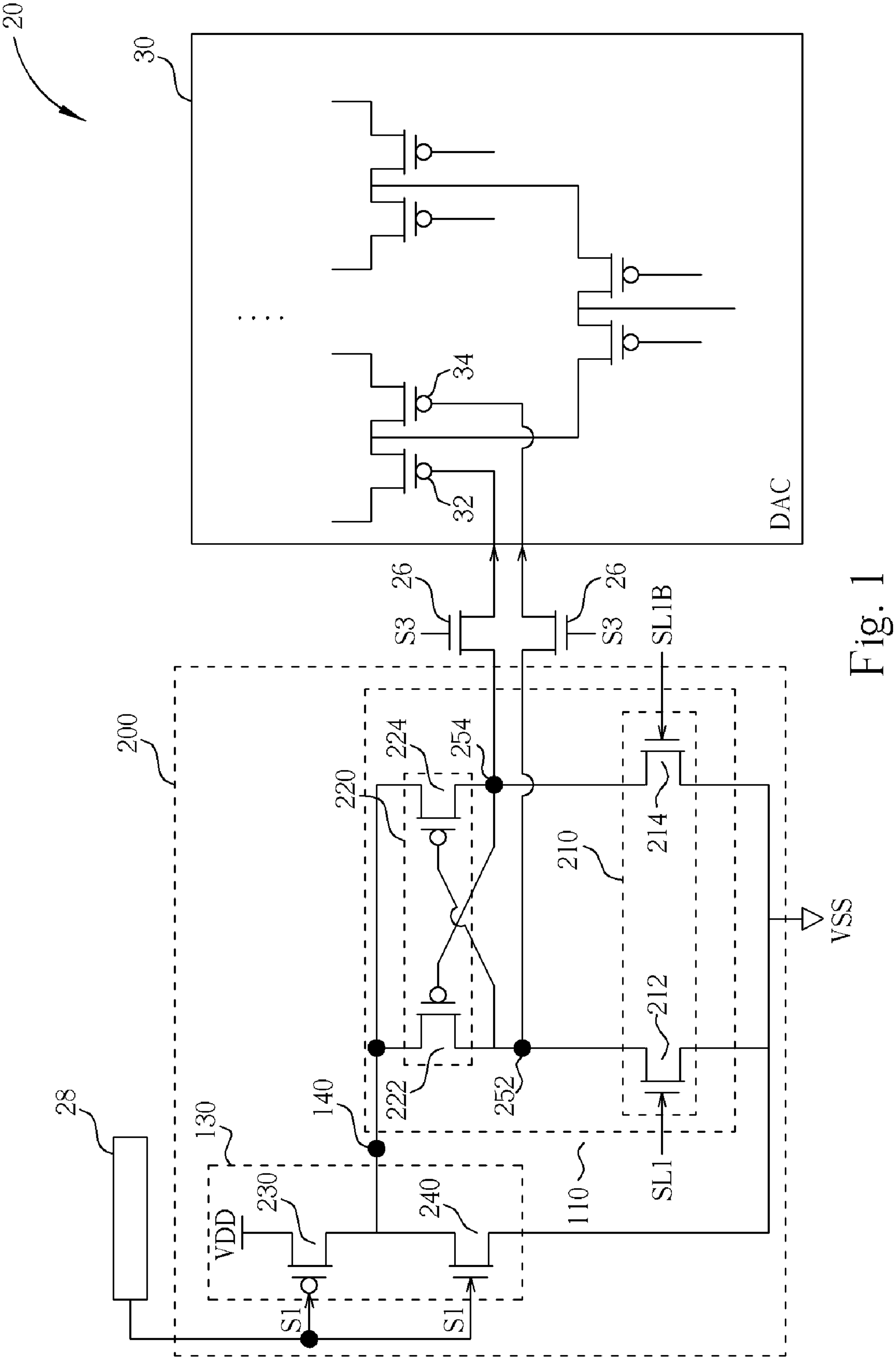
FIG. 1 shows a simplified diagram of a display driver for driving an LCD panel according to an embodiment of the present invention.

Please refer to FIG. 1. FIG. 1 shows a simplified diagram of a display driver 20 for driving an LCD panel according to an embodiment of the present invention. As shown in FIG. 1, the display driver 20 includes a level shifters 200 for respectively receiving input signals SL1, SL1B and outputting shifted signals (not shown), two switches 26, a control circuit 28, and a DAC 30 including two input terminals 32, 34 electrically connected to outputs of the level shifter 200 respectively via the switches 26 directly, wherein the switches 26 are turned off while the level shifters 200 are in a transition to convert the input signals SL1, SL1B into the shifted signals, and the switches 26 are NMOS transistors in this embodiment. The level shifter 200 operates within a first operating voltage range (such as 0-13V), and converts the input signals SL1, SL1B corresponding to a second operating voltage range (such as 0-3.6V) into the shifted signals corresponding to the first operating voltage range. Please note that this embodiment is only for illustrative purposes and is not meant to be a limitation of the present invention.

The level shifter 200 includes: a level converter 110 for receiving the input signals and outputting the shifted signals; and an enabling circuit 130 coupled to a power node 140 of the level converter. When the level shifter is in the transition, the enabling circuit 130 pulls low the power node 140 for a period of time and then connects the power node 140 to a second reference voltage (i.e. VDD). The level converter 110 includes a first pull-down circuit 210 and a first pull-up circuit 220, and the enabling circuit 130 includes a second pull-up circuit 230 and a second pull-down circuit 240. The first pull-down circuit 210 is coupled between an output port (i.e. output terminals 252, 254) of the level shifter 200 and a first reference voltage (i.e. VSS) of the first operating voltage range, and controlled by the input signals SL1, SL1B. In this embodiment, the first pull-down circuit 210 includes NMOS transistors 212, 214. The first pull-up circuit 220 is coupled between the power node 140 and the output port of the level shifter 200. In this embodiment, the first pull-up circuit 220 includes PMOS transistors 222, 224. The second pull-up circuit 230 is coupled between the second reference voltage of the first operating voltage range and the power node 140, and utilized for selectively supplying the second reference voltage to the first pull-up circuit 220 according to a control signal S1. In this embodiment, the second pull-up circuit 230 is, for example, a PMOS transistor 230. The second pull-down circuit 240 is coupled to the power node 140 and the first reference voltage, and utilized for selectively coupling the power node 140 to the first reference voltage according to the control signal S1. In this embodiment, the second pull-down circuit 240 is, for example, an NMOS transistor 240. The switches 26 are respectively electrically connected to the output terminals 252, 254.

For clarity, the gate terminals of the NMOS transistors 212, 214 are coupled to the input signals SL1, SL1B; source terminals of the NMOS transistors 212, 214, 240 are coupled to the first reference voltage; drain terminals of the NMOS transistors 212, 214 are respectively coupled to drain terminals of the PMOS transistors 222, 224; source terminals of the PMOS transistors 222, 224 are coupled to drain terminals of the NMOS transistor 240 and the PMOS transistor 230; a source terminal of the PMOS transistor 230 is coupled to the second reference voltage; a gate terminal of the PMOS transistor 222 is coupled to a drain terminal of the PMOS transistor 224, and a gate terminal of the PMOS transistor 224 is coupled to a drain terminal of the first PMOS transistor. The drain terminals of the NMOS transistor 212 and the PMOS transistor 222 and the gate terminal of the PMOS transistor 224 are electrically connected to the output terminals 252. The drain terminals of the NMOS transistor 214 and the PMOS transistor 224 and the gate terminal of the PMOS transistor 222 are electrically connected to the output terminals 254.

Figure 2:
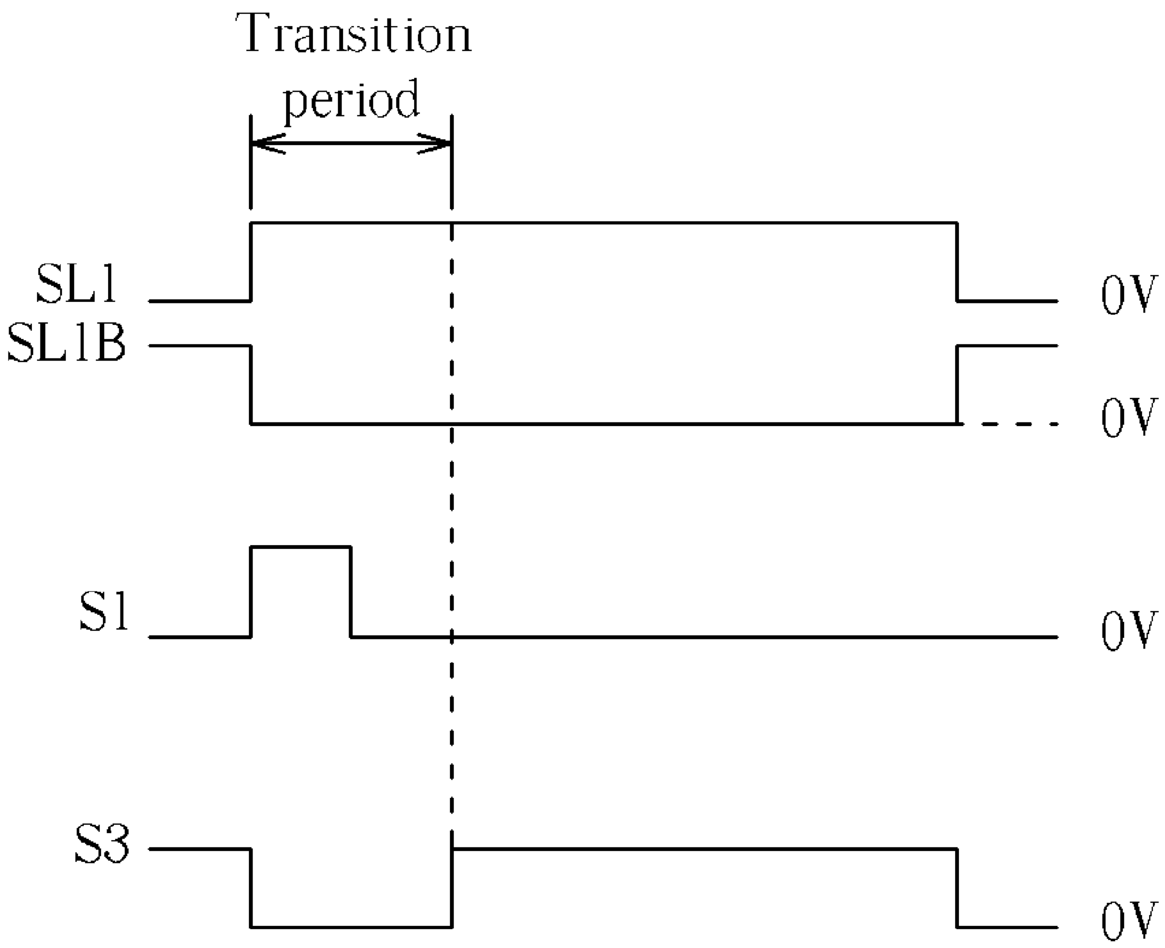
FIG. 2 shows a timing diagram of the input signals SL1, SL1B, the control signal S1, and the switch control signal S3.

The control circuit 28 is utilized for generating the control signal S1, and the switch control signal S3. Please refer to FIG. 2. FIG. 2 shows a timing diagram of the input signals SL1, SL1B, the control signal S1, and the switch control signal S3. While the level shifter 200 is in the transition, the control circuit 28 will set the switch control signal S3 to turn off the switches 26, and set the control signal S1 to turn off the PMOS transistor 230, and turn on the NMOS transistor 240. In this way, voltage levels of the input terminals 32, 34 of the DAC 30 will not be pulled low simultaneously when the NMOS transistor 240 is turned on, and thus the gamma short effect can be avoided. After the NMOS transistors 212, 214 receive the input signals SL1, SL1B, the control circuit 28 will set the control signal S1 to turn off the NMOS transistor 240, and turn on the PMOS transistor 230 to convert the input signals SL1, SL1B into the shifted signals. After the input signals SL1, SL1B are converted into the shifted signals, the control circuit sets the switch control signal S3 to turn on the switches 26 so as to transmit the shifted signals to the DAC 30.

Those skilled in the art will readily observe that numerous modifications and alterations of the device and method may be made while retaining the teachings of the invention.

What is claimed is:

1. A display driver, comprising:
a plurality of level shifters, respectively receiving input signals for outputting shifted signals;
a plurality of switches; and
a digital-to-analog converter (DAC), having a plurality of input terminals electrically connected to outputs of the level shifters respectively via the switches directly;
wherein the switches are directly and respectively connected between the outputs of the level shifters and the input terminals of the DAC, there is only one switch consisting solely of a single transistor component directly connected between each input terminal of the DAC and each output of the level shifters, and the switches are turned off while the level shifters are in a transition to convert the input signals into the shifted signals.

2. The display driver of claim 1, wherein the level shifter comprises:
a level converter, for receiving the input signals and outputting the shifted signals; and
an enabling circuit, coupled to a power node of the level converter, and, in the transition, pulling low the power node for a period of time and then connecting the power node to a power source.

3. The display driver of claim 2, wherein the level shifter operates within a first operating voltage range, and converts the input signals corresponding to a second operating voltage range into the shifted signals corresponding to the first operating voltage range, and the level converter comprises:
a first pull-down circuit, coupled between an output port of the level shifter and a first reference voltage of the first operating voltage range, and controlled by the input signals; and
a first pull-up circuit, coupled between the power node and the output port of the level shifter.

4. The display driver of claim 2, wherein the enabling circuit comprises:
a second pull-up circuit, coupled between a second reference voltage of the first operating voltage range and the power node, for selectively supplying the second reference voltage to the first pull up circuit according to a control signal; and
a second pull-down circuit, coupled to the power node and the first reference voltage, for selectively coupling the power node to the first reference voltage according to the control signal.

5. The display driver of claim 4, wherein one of the second pull-up circuit and the second pull-down circuit is implemented by an NMOS transistor, the other of the second pull-up circuit and the second pull-down circuit is implemented by a PMOS transistor.

6. The display driver of claim 2, further comprising a control circuit, for generating a control signal, and a switch control signal, while in the transition, the control circuit sets the switch control signal to turn off the switches, and sets the control signal to turn off a second pull-up circuit and turn on a second pull-down circuit; after a first pull-down circuit receives the input signals, the control circuit sets the control signal to turn off the second pull-down circuit and turn on the second pull-up circuit to convert the input signals into the shifted signals; and after the input signals are converted into the shifted signals, the control circuit sets the switch control signal to turn on the switches so as to transmit the shifted signals to the DAC.

7. The display driver of claim 6, wherein the level shifter has an output port including a first output terminal and a second output terminal, and the switches comprises:
a first switch element, coupled to the first output terminal, and controlled by the switch control signal; and
a second switch element, coupled to the second output terminal, and controlled by the switch control signal.

8. The display driver of claim 2, wherein the first pull-down circuit comprises a first NMOS transistor and a second NMOS transistor, the first pull-up circuit comprises a first PMOS transistor and a second PMOS transistor, the second pull-down circuit comprises a third NMOS transistor, and the second pull-up circuit comprises a third PMOS transistor.

9. The display driver of claim 8, wherein gate terminals of the first and the second NMOS transistors are coupled to the input signals, source terminals of the first, the second, and the third NMOS transistors are coupled to the first reference voltage, drain terminals of the first and the second NMOS transistors are respectively coupled to drain terminals of the first and the second PMOS transistors, source terminals of the first and the second PMOS transistors are coupled to drain terminals of the third NMOS transistor and the third PMOS transistor, a source terminal of the third PMOS transistor is coupled to the second reference voltage, a gate terminal of the first PMOS transistor is coupled to a drain terminal of the second PMOS transistor, and a gate terminal of the second PMOS transistor is coupled to a drain terminal of the first PMOS transistor.

10. A display, comprising:

a display driver, comprising:

a plurality of level shifters, respectively receiving input signals for outputting shifted signals;

a plurality of switches; and a digital-to-analog converter (DAC), having a plurality of input terminals electrically connected to outputs of the level shifters respectively via the switches directly;

wherein the switches are directly and respectively connected between the outputs of the level shifters and the input terminals of the DAC, there is only one switch consisting solely of a single transistor component directly connected between each input terminal of the DAC and each output of the level shifters, and the switches are turned off while the level shifters are in a transition to convert the input signals into the shifted signals; and a panel, coupled to the display driver.

11. The display of claim 10, wherein the panel is an LCD panel.

12. A method for operating a display driver, comprising:

utilizing a plurality of level shifters of the display driver to respectively receive input signals for outputting shifted signals, wherein a DAC of the display driver has a plurality of input terminals electrically connected to all outputs of the level shifters directly and respectively via a plurality of switches of the display driver directly, the switches are directly and respectively connected between the outputs of the level shifters and the input terminals of the DAC, and there is only one switch consisting solely of a single transistor component directly connected between each input terminal of the DAC and each output of the level shifters; and while the level shifters are in a transition to convert the input signals, turning off the switches to disconnect the outputs of the level shifters from the input terminals of the DAC.

13. The method of claim 12, wherein each level shifter comprises a level converter for receiving the input signals and outputting the shifted signals and an enabling circuit coupled to a power node of the level converter, and the method further comprises:

while each level shifter is in the transition, pulling low the power node for a period of time and then connecting the power node to a power source.

14. The method of claim 12, wherein the display driver further comprises a control circuit for generating a control signal and a switch control signal, and the method further comprises:

while each level shifter is in the transition, utilizing the control circuit to set the switch control signal to turn off the switches;

setting the control signal to turn off a second pull-up circuit and turn on a second pull-down circuit;

after a first pull-down circuit receives the input signals, utilizing the control circuit to set the control signal to turn off the second pull-down circuit and turn on the second pull-up circuit to convert the input signals into the shifted signals; and after the input signals are converted into the shifted signals, utilizing the control circuit to set the switch control signal to turn on the switches so as to transmit the shifted signals to the DAC.

* * * * *